US008605441B2

(12) United States Patent
Hamand et al.

(10) Patent No.: US 8,605,441 B2
(45) Date of Patent: Dec. 10, 2013

(54) LATCHING SYSTEM FOR A MOVEABLE COMPONENT IN A REMOVABLE IHS

(75) Inventors: Karl I. Hamand, Round Rock, TX (US); Zachary A. Cravens, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 318 days.

(21) Appl. No.: 13/188,809

(22) Filed: Jul. 22, 2011

(65) Prior Publication Data

US 2013/0021740 A1  Jan. 24, 2013

(51) Int. Cl.
*G06F 1/16* (2006.01)

(52) U.S. Cl.
USPC ......... 361/726; 361/679.58; 312/294; 29/428

(58) Field of Classification Search
USPC ................. 361/679.58, 726; 312/294; 29/428
See application file for complete search history.

(56) References Cited

U.S. PATENT DOCUMENTS

| | | | |
|---|---|---|---|
| 3,563,628 A | 2/1971 | Pope | |
| 5,243,736 A | 9/1993 | Cannaday et al. | |
| 5,379,184 A * | 1/1995 | Barraza et al. | 361/679.33 |
| 5,734,557 A * | 3/1998 | McAnally et al. | 361/727 |
| 5,795,044 A | 8/1998 | Trewhella, Jr. et al. | |
| 6,330,161 B1 * | 12/2001 | Smith et al. | 361/724 |
| 6,341,060 B1 * | 1/2002 | Chuang | 361/679.33 |
| 6,490,153 B1 * | 12/2002 | Casebolt et al. | 361/679.33 |
| 6,826,044 B2 * | 11/2004 | Gan et al. | 361/679.58 |
| 6,955,380 B1 | 10/2005 | Barr | |
| 7,677,680 B1 | 3/2010 | Chang | |
| 8,208,261 B2 * | 6/2012 | Fan et al. | 361/727 |
| 8,335,080 B2 * | 12/2012 | Huang et al. | 361/679.58 |
| 2003/0080568 A1 * | 5/2003 | Busby et al. | 292/197 |
| 2003/0099094 A1 * | 5/2003 | Coles et al. | 361/726 |
| 2004/0120106 A1 * | 6/2004 | Searby et al. | 361/683 |
| 2005/0243507 A1 * | 11/2005 | Lambert et al. | 361/685 |
| 2009/0213540 A1 * | 8/2009 | Zhang et al. | 361/679.58 |
| 2010/0014823 A1 | 1/2010 | Krampotich et al. | |
| 2010/0085704 A1 * | 4/2010 | Liu | 361/679.58 |
| 2011/0279973 A1 * | 11/2011 | Terwilliger et al. | 361/679.58 |

* cited by examiner

*Primary Examiner* — Lisa Lea Edmonds
(74) *Attorney, Agent, or Firm* — Haynes and Boone, LLP

(57) ABSTRACT

A latching system includes a removable chassis having at least one enclosure coupling feature that is operable to engage an enclosure to house the removable chassis in the enclosure. A moveable component is moveably coupled to the removable chassis. A latch is coupled to the removable chassis. The latch is operable to engage the moveable component when the removable chassis is not housed in the enclosure such that the moveable component is restricted from moving relative to the removable chassis. The latch is operable to disengage the moveable component in response to the removable chassis being housed in the enclosure such that the moveable component is not restricted from moving relative to the removable chassis. The latching system allows the removable chassis to be carried around outside the enclosure without movement of the moveable component, while also allowing the moveable component to move when the removable component is housed in the enclosure.

20 Claims, 10 Drawing Sheets

LATCHING SYSTEM FOR A MOVEABLE COMPONENT IN A REMOVABLE IHS

BACKGROUND

The present disclosure relates generally to information handling systems (IHSs), and more particularly to latching system for a moveable component in a removable IHS.

As the value and use of information continues to increase, individuals and businesses seek additional ways to process and store information. One option is an IHS. An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

In one example, a plurality of removable IHSs such as, for example, modular servers (e.g., blade servers), may be coupled to an IHS enclosure. As the performance of IHSs has grown, modular servers have increased in size and/or weight. For example, the IHS enclosure may house 'single-high' blade servers, 'double-high' blade servers, 'double-wide' blade servers, and a variety of other modular servers known in the art. As the modular servers have increased in size, they have also increased in weight (e.g., around 15 pounds for 'single-high-blade servers and around 30 pounds for 'double-high' or 'double-wide' blade servers.) The Applicants have found that the weight of these modular servers can become an issue, particularly when a moveable component is added to the modular server that had the ability to shift the center of mass of the modular server and present difficulties for a user carrying the modular server.

Accordingly, it would be desirable to provide a latching system for a moveable component in a removable IHS.

SUMMARY

According to one embodiment, a latching system includes a removable chassis including at least one enclosure coupling feature that is operable to engage an enclosure to house the removable chassis in the enclosure, a moveable component that is moveably coupled to the removable chassis, and a latch coupled to the removable chassis, wherein the latch is operable to engage the moveable component when the removable chassis is not housed in the enclosure such that the moveable component is restricted from moving relative to the removable chassis, and wherein the latch is operable to disengage the moveable component in response to the removable chassis being housed in the enclosure such that the moveable component is not restricted from moving relative to the removable chassis.

DETAILED DESCRIPTION

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a display device or monitor, a network server or storage device, a switch router or other network communication device, or any other suitable device and may vary in size, shape, performance, functionality, and price. The IHS may include memory, one or more processing resources such as a central processing unit (CPU) or hardware or software control logic. Additional components of the IHS may include one or more storage devices, one or more communications ports for communicating with external devices as well as various input and output (I/O) devices, such as a keyboard, a mouse, and a video display. The IHS may also include one or more buses operable to transmit communications between the various hardware components.

Figure 1:
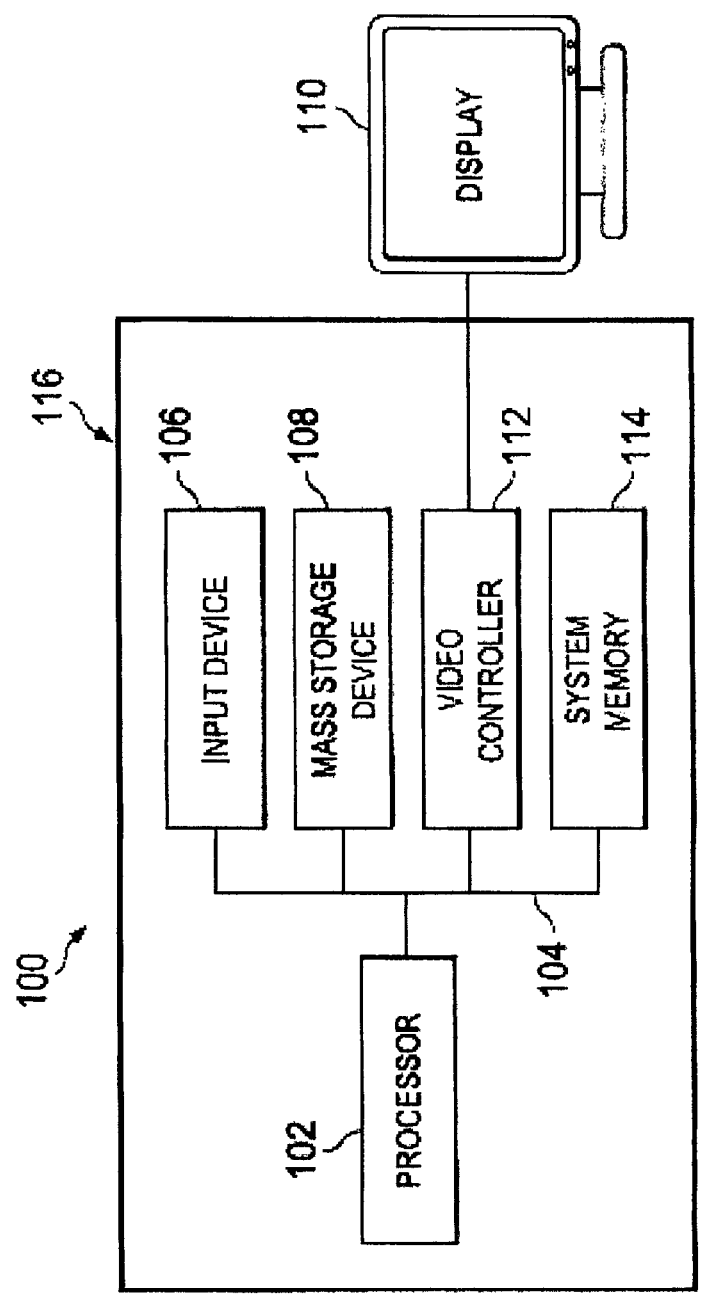
FIG. 1 is a schematic view illustrating an embodiment of an information handling system (IHS).

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
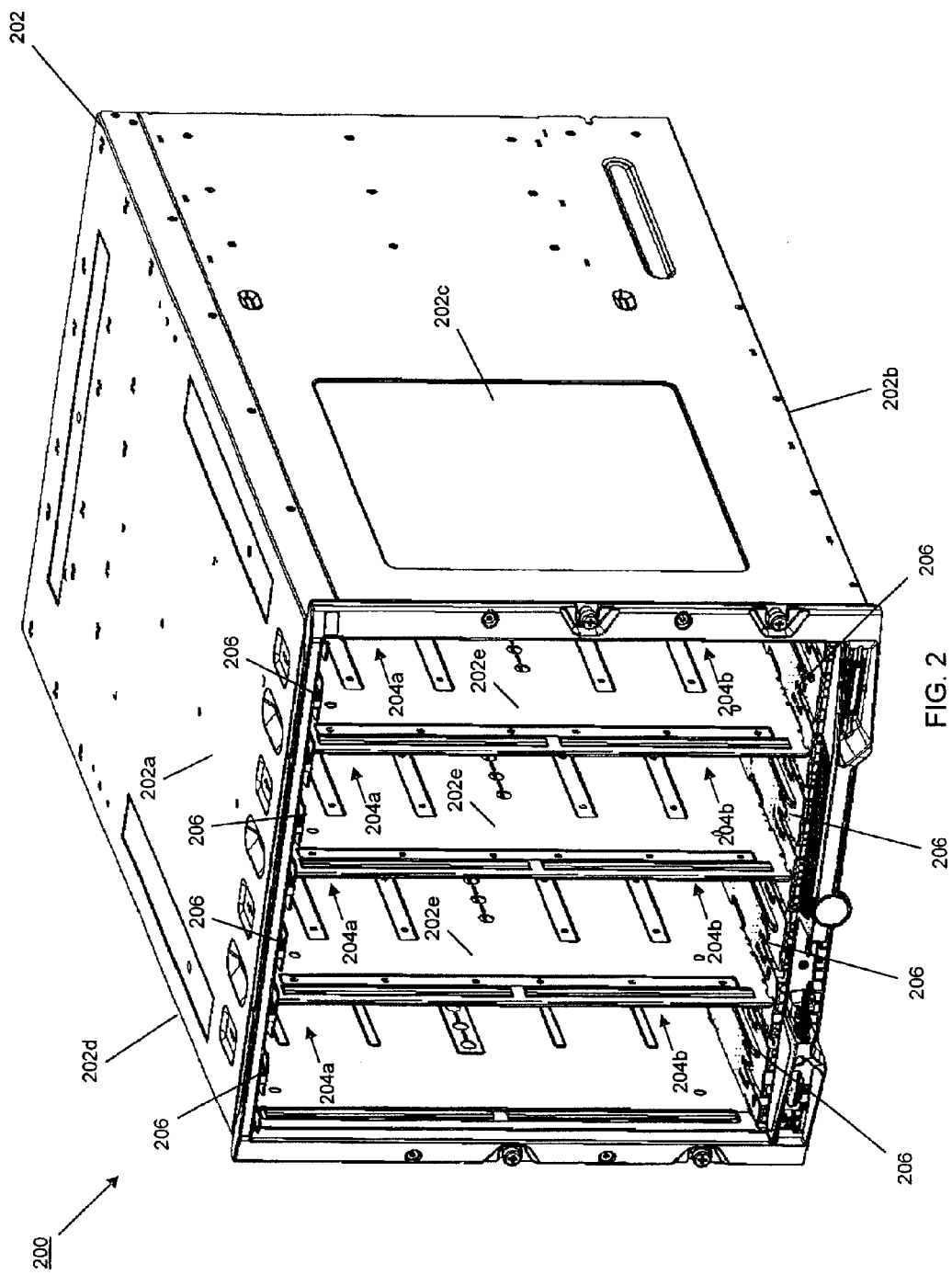
FIG. 2 is a perspective view illustrating an embodiment of an IHS enclosure.

Referring now to FIG. 2, an embodiment of an enclosure 200 is illustrated. While the enclosure 200 is described below as an IHS enclosure that houses modular servers (e.g., blade servers, storage blades, and/or a variety of other modular servers known in the art), one of skill in the art will recognize that the enclosure 200 may include enclosures for housing a variety of removable components without departing from the scope of the present disclosure. The enclosure 200 includes a base 202 having a top wall 202a, a bottom wall 202b located opposite the base 202 from the top wall 202a, a side wall 202c that extends between first edges of the top wall 202a and the bottom wall 202b, and a side wall 202d that is located opposite the base 202 from the side wall 202c and extends between second edges of the top wall 202a and the bottom wall 202b. A plurality of intermediate walls 202e extends between the top wall 202a and the bottom wall 202b in a substantially parallel and spaced apart orientation from each other and the side walls 202c and 202d. A plurality of removable component housings 204a and 204b are defined by the base between side walls 202c and 202d and intermediate walls 202e. While the removable components housings 204a and 204b are described below as modular server housings, one of skill in the art will recognize that a variety of removable components may be housed in the removable components housings 204a and 204b without departing from the scope of the present disclosure.

A plurality of removable component coupling features 206 may extend from the top wall 202a, the bottom wall 202b, the side walls 202c and 202d, and/or the intermediate walls 202e adjacent the removable components housings 204a and 204b. While the removable component coupling features 206 are described below as server coupling features, one of skill in the art will recognize that a variety of removable components may engage the removable component coupling features 206 to couple the removable components to the enclosure 200 without departing from the scope of the present disclosure. A rear wall (not illustrated) may extend between the top wall 202a, the bottom wall 202b, and the side walls 202c and 202d, and be located adjacent each of the removable components housings 204a and 204b. Furthermore, the rear wall may include connectors and/or other couplers (not illustrated) known in the art for electrically coupling to a modular server or other information handling system that is positioned in the removable components housings 204a and 204b.

Figure 3A:
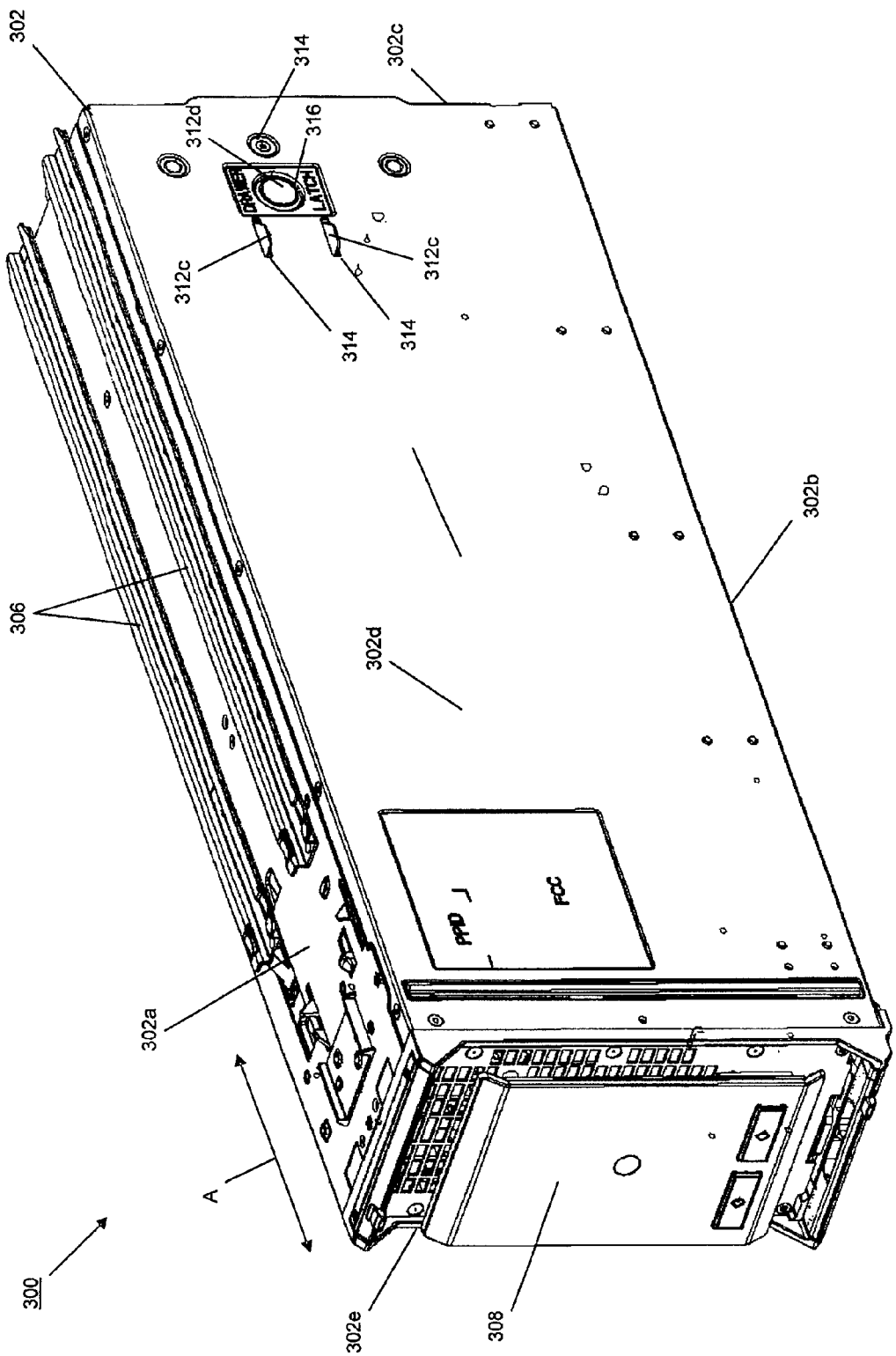
FIG. 3a is a perspective view illustrating an embodiment of a removable IHS chassis including an moveable component.
Figure 3B:
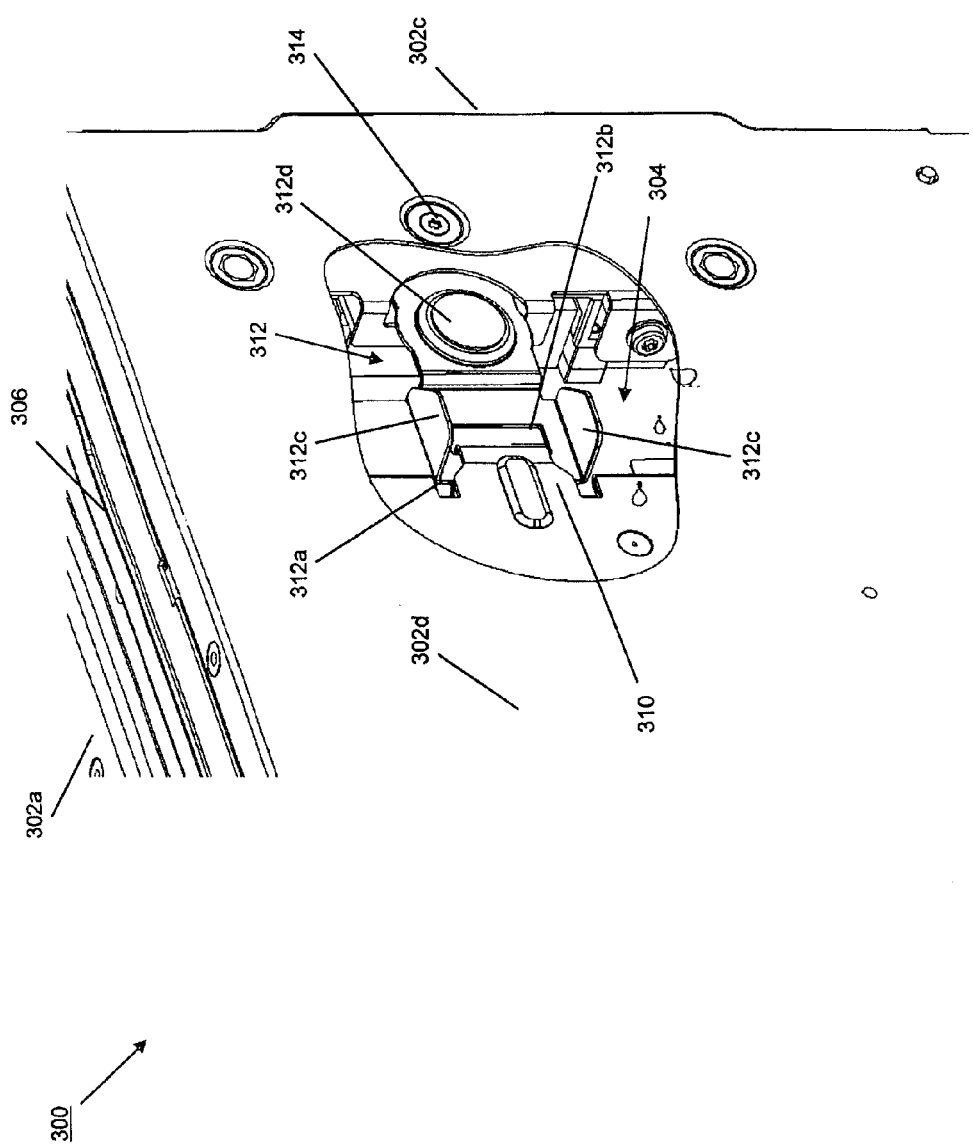
FIG. 3b is a cut-away perspective view illustrating an embodiment of a latch on the removable IHS chassis of FIG. 3a in engagement with the moveable component.
Figure 3C:
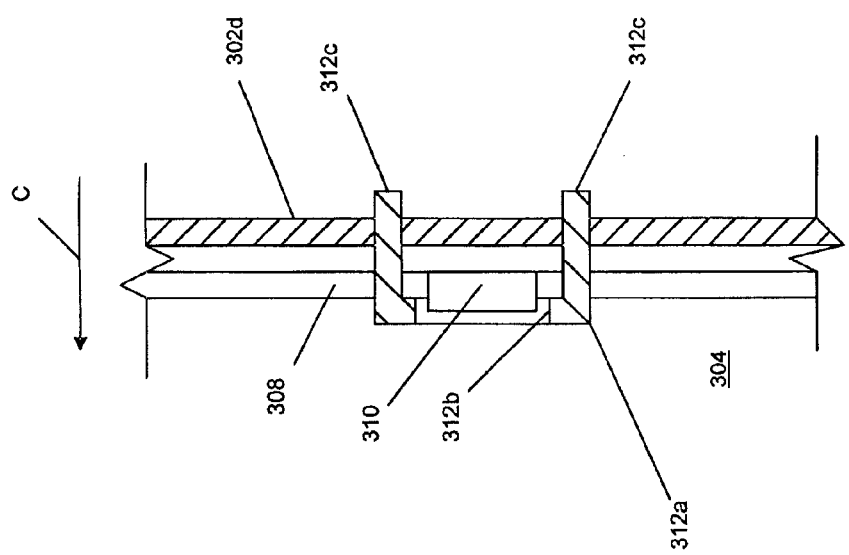
FIG. 3c is a cross-sectional view illustrating an embodiment of the latch on the removable IHS chassis of FIG. 3a in engagement with the moveable component.

Referring now to FIGS. 3a, 3b, and 3c, an embodiment of a server 300 is illustrated. In an embodiment, the server 300 may be the IHS 100, described above with reference to FIG. 1, and may include some or all of the IHS components described above with reference to FIG. 1. However, while the illustrated embodiment below is of a server IHS, one of skill in the art will recognize that a variety of non-server and/or non-IHS removable components that include a removable chassis having a moveable component and a latch, as discussed below, will fall within the scope of the present disclosure. The server 300 includes a server chassis 302 having a top surface 302a, a bottom surface 302b located opposite the server chassis 302 from the top surface 302a, a rear surface 302c extending between the top surface 302a and the bottom surface 302b, and a pair of opposing side surface 302d and 302e that are located opposite the server chassis 302 from each other and that each extend between the top surface 302a, the bottom surface 302b, and the rear surface 302c. A housing 304 is defined by the server chassis 302 between the top surface 302a, the bottom surface 302b, the rear surface 302c, and the side surfaces 302d and 302e. A plurality of enclosure coupling features 306 are located on the top surface 302a. A plurality of enclosure coupling features (not illustrated) are also located on the bottom surface 302b.

A moveable component 308 is moveably coupled to the server chassis 302 using methods known in the art such that the moveable component 308 is operable to move relative to the server chassis 302 along a line A, as described in further detail below. For example, the server chassis 302 may include a track system and the moveable component 308 may include track elements that engage the track system to couple the moveable component 308 to the server chassis 302 while allowing relative movement between the moveable component 308 and the server chassis 302. The moveable component 308 includes a latch coupling 310 that is located in the housing 304 of the server chassis 302 when the moveable component 308 is coupled to the server chassis 302.

A latch 312 is coupled to the server chassis 302 (e.g., using a coupling member 314 that engages the side surface 302d of the server chassis 302 in the illustrated embodiment.) The latch 312 includes a base 312a that defines a latch coupling aperture 312b. A portion of the latch 312 includes a plurality of latch actuation members 312c that extend substantially perpendicularly from the base 312a on opposite sides of the latch coupling aperture 312b. A release member 312d is located between the base 312a and the coupling of the latch 312 to the server chassis 302. A plurality of actuation member apertures 314 are defined by the server chassis 302 and extend through the side surface 302d to the housing 304. A release member aperture 316 is defined by the server chassis 302 and extends through the side surface 302d to the housing 304. In an embodiment, at least a portion of the latch 312 includes a resilient member (e.g., the portion of the latch 312 between the release member 312d and the coupling of the latch 312 to the server chassis 302) that biases the latch 312 towards the side surface 302d of the server chassis 302 such that the actuation members 312c extend through the actuation member apertures 314 and out from the side surface 302d of the server chassis 302 and the release member 312d is located in the release member aperture 316, as illustrated in FIGS. 3a and 3c.

Referring now to FIGS. 3a, 3b, 3c, and 4a, a method 400 for latching a moveable component in a removable chassis is illustrated. The method 400 begins at block 402 where a removable chassis including a moveable component is provided. In an embodiment, the server chassis 302 including the moveable component 308, described above with reference to FIGS. 3a, 3b, and 3c, is provided. The method 400 then proceeds to block 404 where the moveable component is restricted from moving relative to the removable chassis when the removable chassis is not housed in an enclosure. The server chassis 302 is operable to be coupled to the enclosure 200, as described in further detail below. However, as discussed above, the moveable component 308 is moveably coupled to the server chassis 302 such that the moveable component 308 may be moved relative to the server chassis 302 along the line A, as illustrated in FIG. 3a. Thus, when the server chassis 302 is not coupled to the enclosure 200, movement of the moveable component 308 relative to the server chassis 302 is not desirable as such movement can shift the center of gravity of the server chassis 302, which presents difficulties for a user carrying the server chassis 302.

This undesirable movement of the moveable component 308 relative to the server chassis 302 is remedied by the latching system of the present disclosure. When the moveable component 308 is moved along the line A and towards the rear surface 302c of the server chassis 302, the latch coupling 310 on the moveable component 308 will engage the latch 312 and become positioned in the latch coupling aperture 312b when the moveable component 308 is completely housed in the server chassis 302, as illustrated in FIGS. 3a, 3b, and 3c. For example, as the moveable component 308 is moved along the line A and towards the rear surface 302c of the server chassis 302, the latch coupling 310 will engage the base 312a of the latch 312. In an embodiment, the latching coupling 310 and/or the base 312a of the latch 312a include features that, when engaged, cause the latch 312 to flex away from the side surface 302d of the server chassis 302 as the moveable component 308 moves towards the rear surface 302c until the latch 312 is allowed to resiliently bias back towards the side surface 302d of the server chassis 302 such that the latch coupling 310 becomes positioned in the latch coupling aperture 312b. Engagement of the latch coupling 310 and the latch 312 restricts the moveable component 308 from moving relative to the server chassis 302 along the direction A and away from the rear surface 302c of the server chassis 302. Thus, with the latch 312 and the latch coupling 310 engaged, the server chassis 302 may be carried around outside the enclosure 200 without the moveable component 308 shifting the center of gravity of the server chassis 302 by moving undesirably relative to the server chassis 302.

Figure 4A:
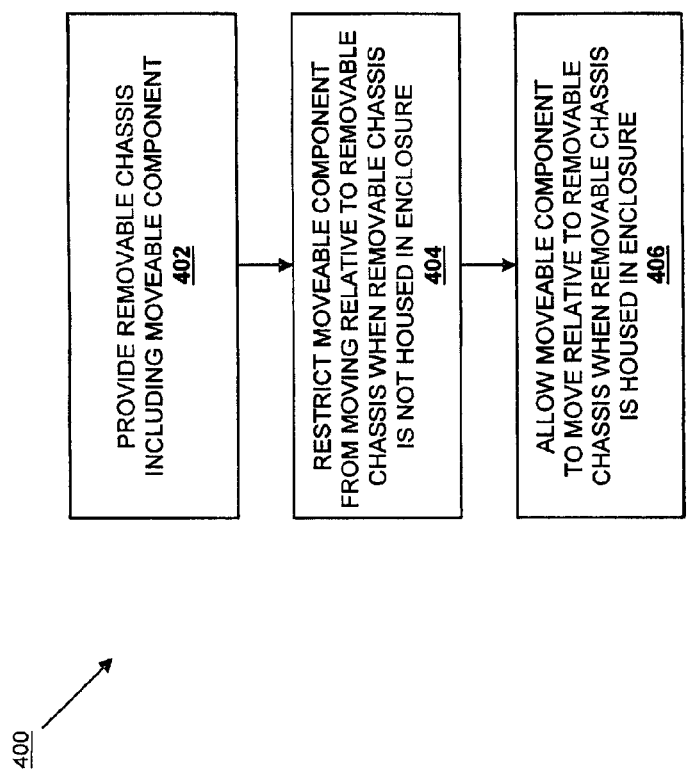
FIG. 4a is a flow chart illustrating an embodiment of a method for latching a moveable component in a removable IHS chassis.
Figure 4B:
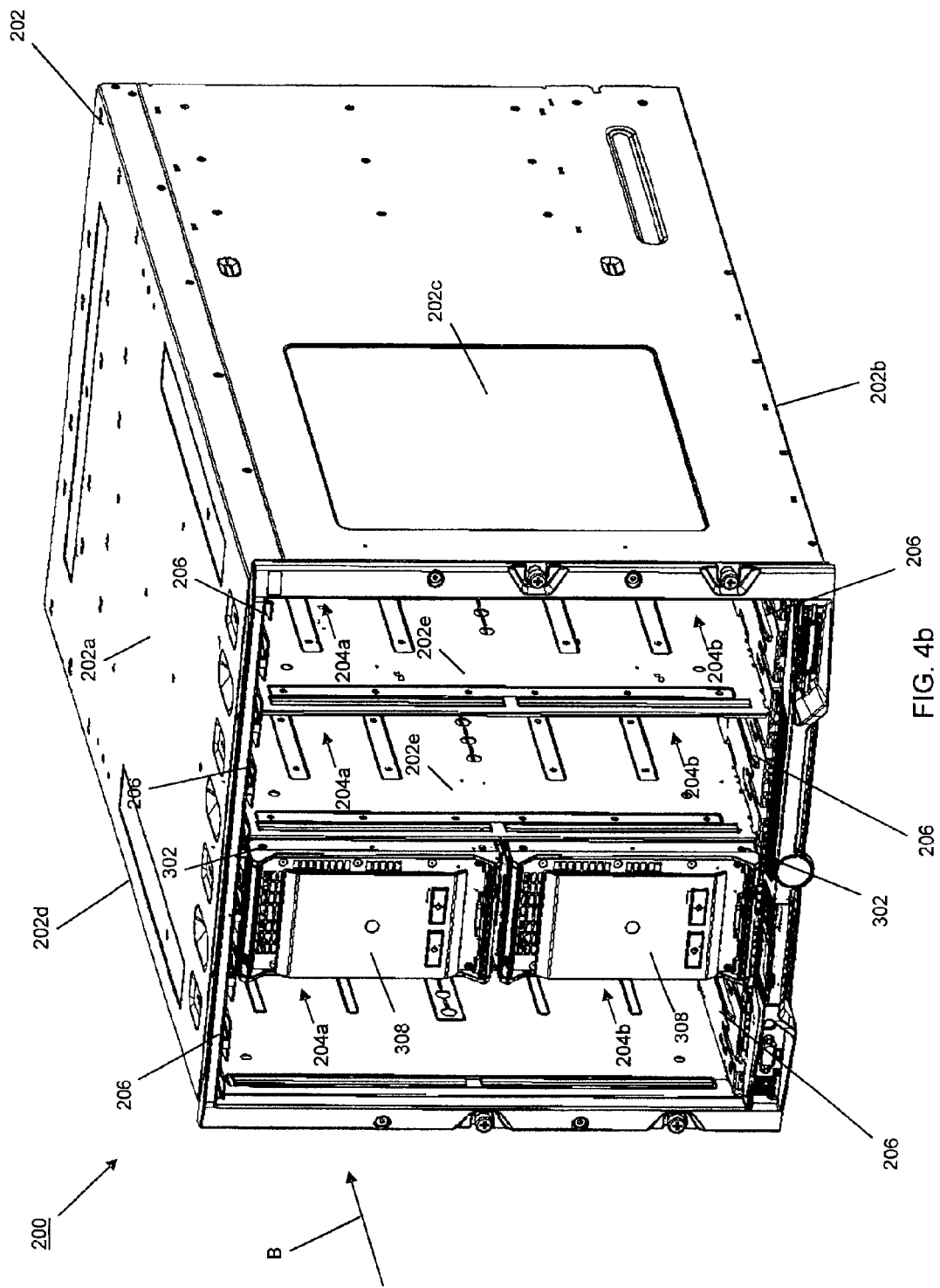
FIG. 4b is a perspective view illustrating an embodiment of a plurality of the removable chassis of FIG. 3a housed in the IHS enclosure of FIG. 2.
Figure 4C:
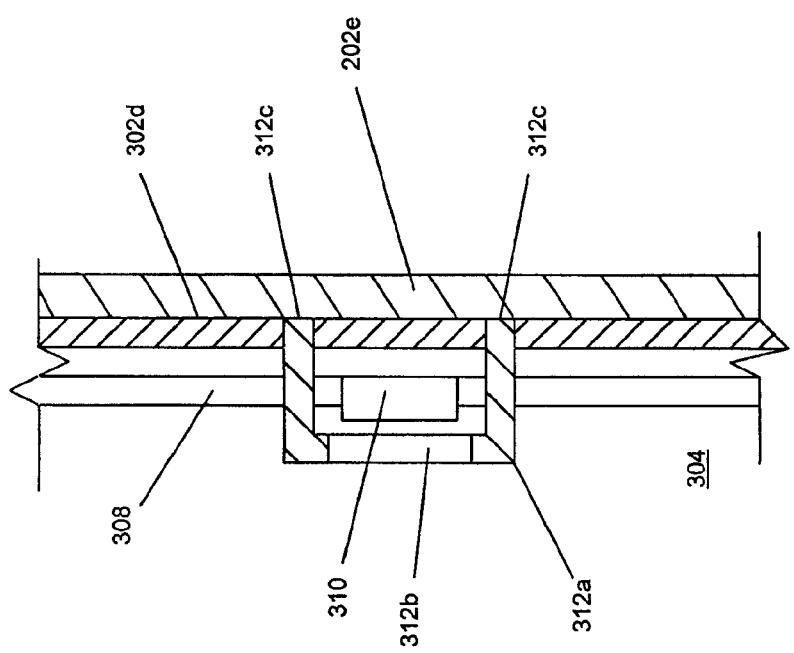
FIG. 4c is a cross-sectional view illustrating an embodiment of the latch on the removable IHS chassis of FIG. 4c disengaged from the moveable component in response to being housed in IHS the enclosure.

Referring now to FIGS. 4a, 4b, 4c, 4d, and 4e, the method 400 then proceeds to block 406 where the moveable component is allowed to move relative to the removable chassis when the removable chassis is housed in an enclosure. The server chassis 302 may be positioned in the enclosure 200 by positioning the rear surface 302c of the server chassis 302 adjacent one of the removable components housings 204a and 204b and moving the server chassis 302 in a direction B towards the enclosure 200 such that either the enclosure coupling features 306 on the top surface 302a of the server chassis 302 engage the removable component coupling features 206 adjacent the top surface 202a of the enclosure 200 when the server chassis 302 enters the removable component housing 204a, or the enclosure coupling features (not shown) on the bottom surface 302b of the server chassis 302 engage the removable component coupling features 206 adjacent the bottom surface 202b of the enclosure 200 when the server chassis 302 enters the removable component housing 204b, as illustrated in FIG. 4b. In one embodiment, several features of the server chassis 302 and the enclosure 200 (e.g., the coupling features that provide for coupling the server chassis 302 to the enclosure 200) are described in more detail in U.S. patent application Ser. No. 13/094,317, filed on Apr. 26, 2011, the disclosure of which is incorporated herein by reference.

Figure 4D:
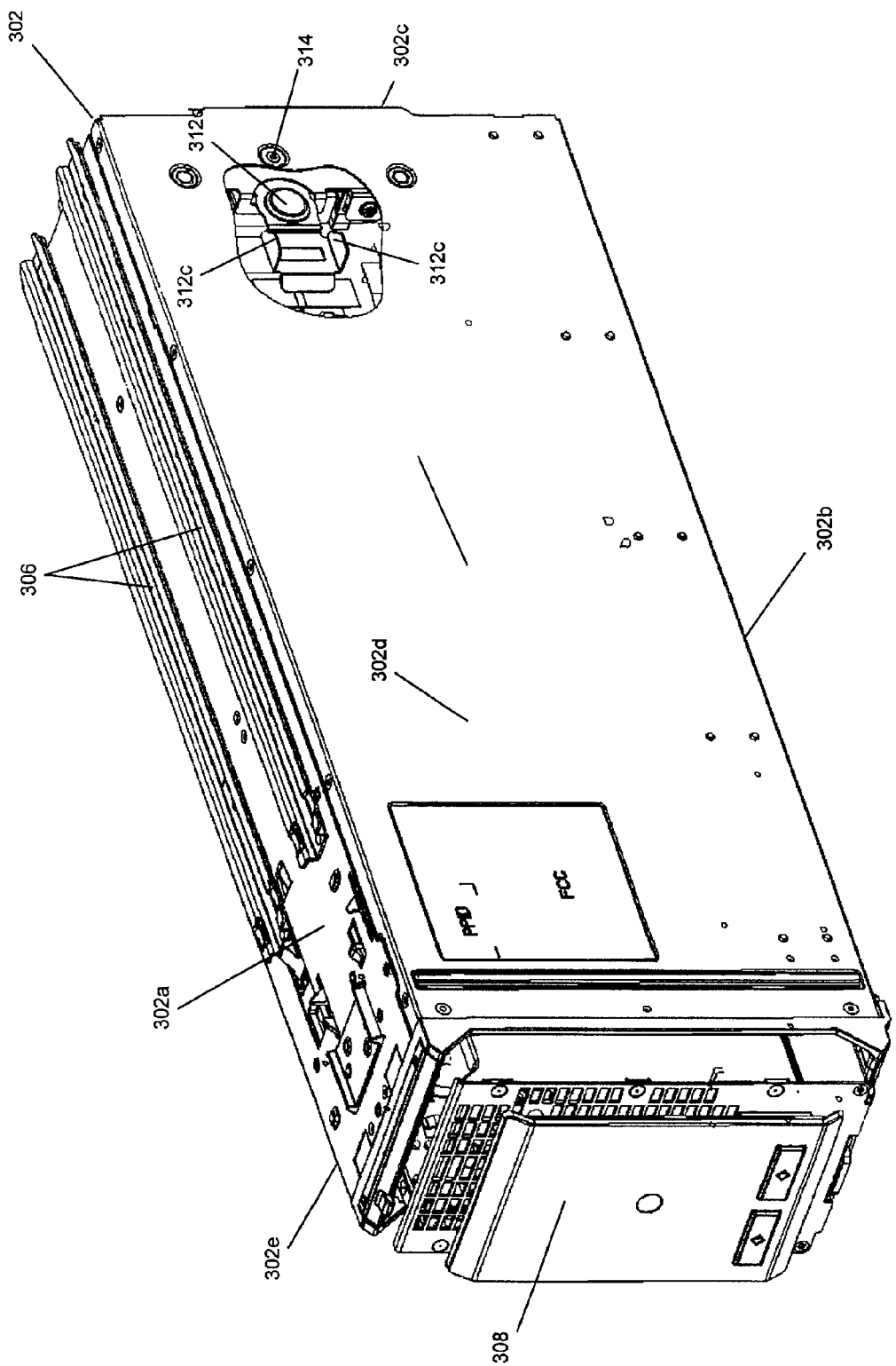
FIG. 4d is a perspective view illustrating an embodiment of the latch on the removable IHS chassis disengaged from the moveable component, and with the moveable component moved relative to the removable IHS chassis.
Figure 4E:
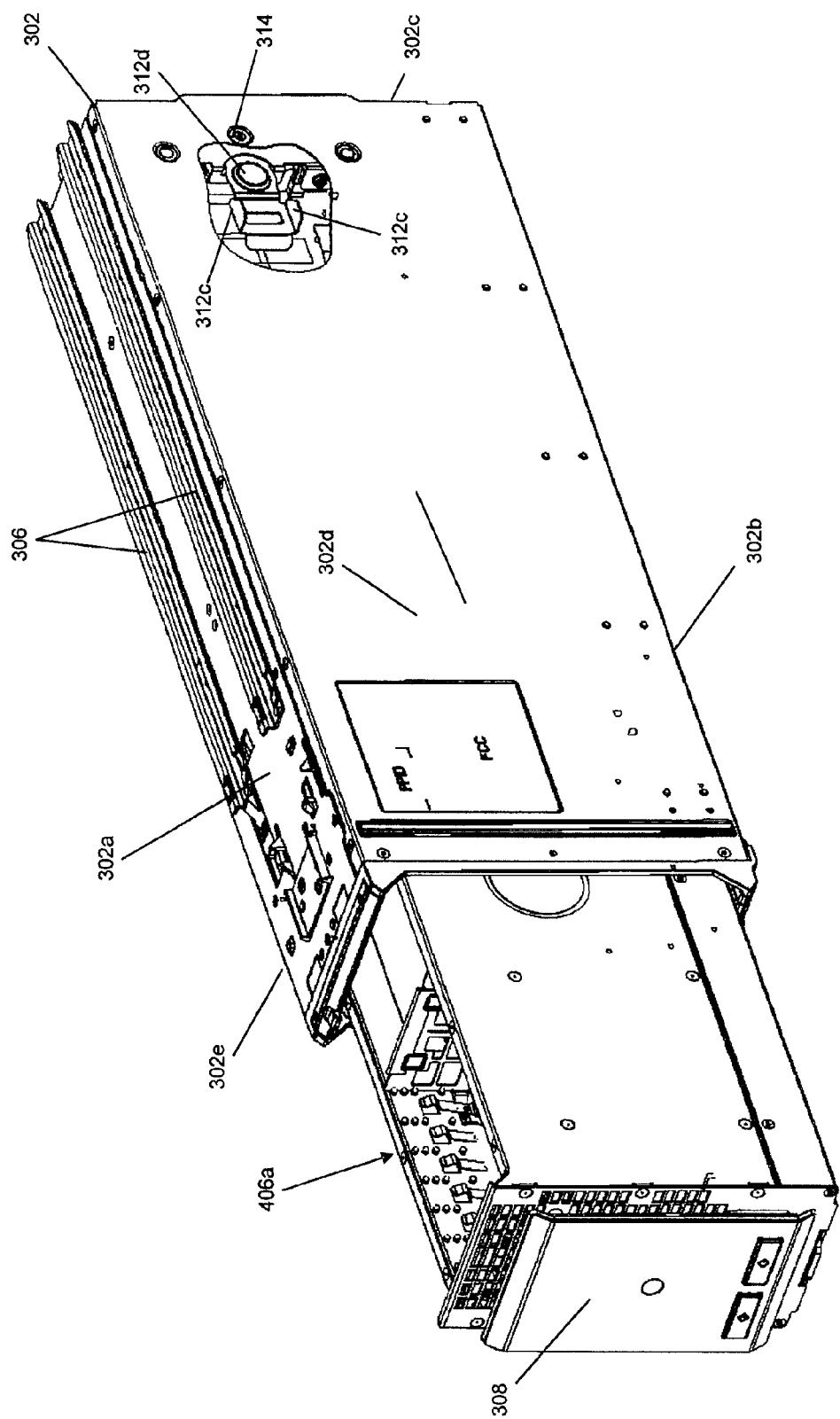
FIG. 4e is a perspective view illustrating an embodiment of the latch on the removable IHS chassis disengaged from the moveable component, and with the moveable component moved relative to the removable IHS chassis.

As discussed above, the latch 312 is biased towards the side surface 302d of the server chassis 302 such that the actuation members 312c extend through the actuation member apertures 314 and out from the side surface 302d of the server chassis 302, as illustrated in FIGS. 3a and 3c. However, as the server chassis 302 is moved in the direction B, the actuation members 312c engage a wall in the server chassis 302 (e.g., the intermediate wall 202e in the illustrated embodiment) such that the latch 312 is flexed in a direction C from the position illustrated in FIGS. 3a and 3c to the position illustrated in FIGS. 4c and 4d. Flexing of the latch 312 in the direction C causes the latch coupling 310 to disengage the latch 312 (e.g., such that the latch coupling 310 is no longer positioned in the coupling aperture 312b in the illustrated embodiment) such that the moveable component 308 is no longer resisted from moving relative to the server chassis 302 by the latch 312. In an embodiment, the removable component coupling features 206 or other features on the enclosure 200 may include securing features that secure the server chassis 302 in the removable components housings 204a and/or 204b such that the server chassis 302 is resisted from moving relative to the enclosure 200. With the server chassis 302 positioned and/or secured in the enclosure 200, the engagement of the wall (e.g., the intermediate wall 202e in the illustrated embodiment) and the actuation members 312c on the latch 312, illustrated in FIG. 4c, ensures that the latch coupling 310 on the moveable component 308 and the latch 312 do not engage such that the moveable component 308 is allowed to move relative to the server chassis 302. Thus, the moveable component 308 may be moved along the line A, illustrated in FIG. 3a, and away from the rear surface 302c of the server chassis 302 such that the moveable component 308 is extended from the server chassis 302 and the enclosure 200, as illustrated in FIGS. 4d and 4e (FIGS. 4d and 4e have been illustrated without the server chassis 302 for clarity of discussion). In the illustrated embodiment, the moveable component 308 is a blade drawer on a storage blade that defines a drawer housing 406a that may house storage media (e.g., hard drives), controllers, and/or a variety of other IHS components known in the art, and one of skill in the art will recognize that a storage blade blade drawer including hard drives may account for a substantial portion for the overall weight of the storage blade. While not illustrated for clarity of discussion, one of skill in the art will recognize that the enclosure 200, the server chassis 302, and/or the drawer housing 406a may include electrical connectors that engage upon the coupling of, for example, the server chassis 302 with the enclosure 200, the moveable component 308 with the server chassis 302, the IHS components in the drawer housing 406a, etc.

The server chassis 302 may be removed from the enclosure 200 by, for example, unsecuring the server chassis 302 from the enclosure 200 and/or moving the server chassis 302 relative to the enclosure in a direction that is opposite the direction B. That movement will cause the actuation members 312c on the latch 312 to disengage the wall on the server chassis 302 (e.g., the intermediate wall 202e) and allow the latch 312 to be biased such that the actuation members 312c extend back through the actuation member apertures 314 and out from the side surface 302d of the server chassis 302, as illustrated in FIGS. 3a and 3c. With the latch 312 biased such that the actuation members 312c extend back through the actuation member apertures 314 and out from the side surface 302d of the server chassis 302, the latch coupling 310 on the moveable component 308 may engage the latch 312 as discussed above in order to resist movement of the moveable component 308 relative to the server chassis 302. As can be seen from the description above, if the moveable component 308 is completely housed in the server chassis 302 when the server chassis is removed from the enclosure 200, the latch coupling 310 on the moveable component 308 will be automatically engaged by the latch 312 to resist relative movement of the moveable component 308 and the server chassis 302.

Furthermore, with the server chassis 302 removed from the enclosure 200 and the movement of the moveable component 308 relative to the server chassis 302 resisted due to the engagement of the latch coupling 310 and the latch 312, a user may wish to move the moveable component 308 (e.g., to access the drawer housing 406a.) In such a situation, the user may actuate the release member 312d by providing a force on the release member 312d towards the housing 304 of the server chassis 302 that overcomes the biasing force of the latch 312 to flex the latch 312 such that latch coupling 310 on the moveable component 308 disengages the latch 312, as discussed above, and the moveable component 308 is no longer resisted from moving relative to the server chassis 302 by the latch 312. The user may then move the moveable component 308 relative to the server chassis 302 before releasing the release member 312d and allowing the latch 312 to bias back into the position with the actuation members 312c extending through the actuation member apertures 314. When the user then wishes to move the server chassis 302 again, the moveable component 308 may simply be moved relative to the server chassis 302 and towards the rear surface 302c of the server chassis to reengage the latch coupling 310 on the moveable component 308 and the latch 312 engage to again resist movement of the moveable component 308 relative to the server chassis 302.

Thus, a latching system has been described that allows a moveable component in a removable chassis to move relative to the removable chassis when the removable chassis is positioned in an enclosure, but resists the movement of the moveable component relative to the removable chassis when the removable chassis is removed from the enclosure. Such as latching system provides the functionality of the moveable component when it is needed, but prevents movement of the moveable component when the server chassis is being moved outside of the enclosure. Such a latching system allows for safer movement of the removable chassis by preventing the shifting of the center of gravity of the server chassis that provides problems for the user that is moving the server chassis.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A latching system, comprising:
a removable chassis including at least one enclosure coupling feature that is operable to engage an enclosure to house the removable chassis in the enclosure;
a moveable component that is moveably coupled to the removable chassis; and
a latch coupled to the removable chassis, wherein the latch is operable to engage the moveable component when the removable chassis is not housed in the enclosure such that the moveable component is restricted from moving relative to the removable chassis, and wherein the latch is operable to disengage the moveable component in response to the removable chassis being housed in the enclosure such that the moveable component is not restricted from moving relative to the removable chassis.

2. The latching system of claim 1, wherein the latch includes a portion that extends from an outer surface of the removable chassis when the removable chassis is not housed in the enclosure, and wherein the portion of the latch engages the enclosure in response to the removable chassis being housed in the enclosure and causes the latch to disengage the moveable component.

3. The latching system of claim 1, wherein the latch includes a release member that does not cause the moveable component to disengage the latch in response to the removable chassis being housed in the enclosure, and wherein the release member is operable to be actuated by a user to disengage the moveable component and the latch.

4. The latching system of claim 1, wherein the moveable component includes a drawer defining a drawer housing.

5. The latching system of claim 4, wherein the latch engages the moveable component when the removable chassis is not housed in the enclosure and the drawer housing is completely housed in the removable chassis.

6. The latching system of claim 1, wherein the movable component includes a latch coupling that is operable to engage and disengage the latch.

7. The latching system of claim 6, wherein the latch is biased such that the latch is operable to engage the latch coupling when the removable chassis not housed in the enclosure, and wherein the latch flexes away from the latch coupling when the removable chassis is housed in the enclosure.

8. The latching system of claim 1, further comprising:
an enclosure that defines a plurality of removable component housings and includes at least one removable component coupling feature that is located adjacent each removable component housing and that is operable to engage the at least one enclosure coupling feature on the removable chassis.

9. An information handling system (IHS), comprising:
an IHS enclosure that defines a server housing and includes at least one server coupling feature that is located adjacent the server housing;
a server including:
a server chassis including at least one enclosure coupling feature that is operable to engage the at least one server coupling feature to house the server in the server housing;
a moveable component that is moveably coupled to the server chassis; and
a latch coupled to the server chassis; and
wherein the latch is operable to engage the moveable component when server is not housed in the IHS enclosure such that the moveable component is restricted from moving relative to the server chassis, and wherein the latch is operable to disengage the moveable component in response to the server being housed in the IHS enclosure such that the moveable component is not restricted from moving relative to the server chassis.

10. The IHS of claim 9, wherein the latch includes a portion that extends from an outer surface of the server chassis when the server is not housed in the IHS enclosure, and wherein the portion of the latch engages the IHS enclosure in response to the server being housed in the IHS enclosure and causes the latch to disengage the moveable component.

11. The IHS of claim 9, wherein the latch includes a release member that does not cause the moveable component to disengage the latch in response to the server being housed in the IHS enclosure, and wherein the release member is operable to be actuated by a user to disengage the moveable component and the latch.

12. The IHS of claim 9, wherein the moveable component includes a drawer defining a drawer housing that houses at least one IHS component.

13. The IHS of claim 12, wherein the latch engages the moveable component when the server is not housed in the IHS enclosure and the drawer housing is completely housed in the server chassis.

14. The IHS of claim 9, wherein the movable component includes a latch coupling that is operable to engage and disengage the latch.

15. The IHS of claim 14, wherein the latch is biased such that the latch is operable to engage the latch coupling when the server is not housed in the IHS enclosure, and wherein the latch flexes away from the latch coupling when the server is housed in the IHS enclosure.

16. The IHS of claim 9, wherein the server houses a processor and a memory coupled to the processor.

17. A method for latching a moveable component in a removable chassis, comprising:

provided a removable chassis that includes a latch and a moveable component that is moveable relative to the removable chassis;

engaging the moveable component with the latch when the removable chassis is not positioned in an enclosure such that the moveable component is restricted from moving relative to the removable chassis; and positioning the removable chassis in the enclosure and, in response, disengaging the latch and the moveable component such that the moveable component is not restricted from moving relative to the removable chassis.

18. The method of claim 17, wherein a portion of the latch extends from an outer surface of the removable chassis, and the method further comprises:

engaging the portion of the latch with the enclosure when the removable chassis is positioned in the enclosure to disengage the latch and the moveable component.

19. The method of claim 18, wherein the latch is biased to engage the moveable component when the removable chassis is not housed in the enclosure, and the method further comprises:

flexing the latch away from the moveable component in response to the portion of the latch engaging the enclosure.

20. The method of claim 17, wherein the latch includes a release member that does not cause the moveable component to disengage the latch in response to the server being housed in the enclosure, and the method further comprises:

actuating the release member on the latch when the removable chassis is not positioned in the enclosure in order to disengage the latch and the moveable component such that the moveable component is not restricted from moving relative to the removable chassis.

* * * * *